(12) United States Patent
Kang

(10) Patent No.: US 8,159,892 B2
(45) Date of Patent: Apr. 17, 2012

(54) NONVOLATILE MEMORY DEVICE AND METHOD OF TESTING THE SAME

(75) Inventor: Tai Kyu Kang, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 247 days.

(21) Appl. No.: 12/702,597

(22) Filed: Feb. 9, 2010

(65) Prior Publication Data

US 2010/0290288 A1    Nov. 18, 2010

(30) Foreign Application Priority Data

May 13, 2009   (KR) .................. 10-2009-0041672

(51) Int. Cl.
*G11C 29/00* (2006.01)
(52) U.S. Cl. .................................. 365/201; 365/189.05
(58) Field of Classification Search .................. 365/201, 365/189.05, 211; 714/724, 718, 727
See application file for complete search history.

(56) References Cited

U.S. PATENT DOCUMENTS

| | | | | |
|---|---|---|---|---|
| 5,297,148 | A | * | 3/1994 | Harari et al. .................. 714/710 |
| 6,076,177 | A | * | 6/2000 | Fontenot et al. ............... 714/724 |
| 7,610,528 | B2 | * | 10/2009 | Laurent et al. ................ 714/724 |

FOREIGN PATENT DOCUMENTS

KR   1020080019459    3/2008

OTHER PUBLICATIONS

Notice of Allowance issued from Korean Intellectual Property Office on Nov. 30, 2010.

* cited by examiner

*Primary Examiner* — Vu Le
(74) *Attorney, Agent, or Firm* — IP & T Group LLP

(57) ABSTRACT

A nonvolatile memory device includes a storage unit configured to store pattern data selected based on a test command set, and a control unit configured to consecutively perform a program operation on a number of pages in response to the pattern data to obtain programmed pages, consecutively perform a read operation on the programmed pages, and provide information about a bit line coupled to a fail memory cell and about a number of fail bit lines checked as a result of the read operation.

16 Claims, 4 Drawing Sheets

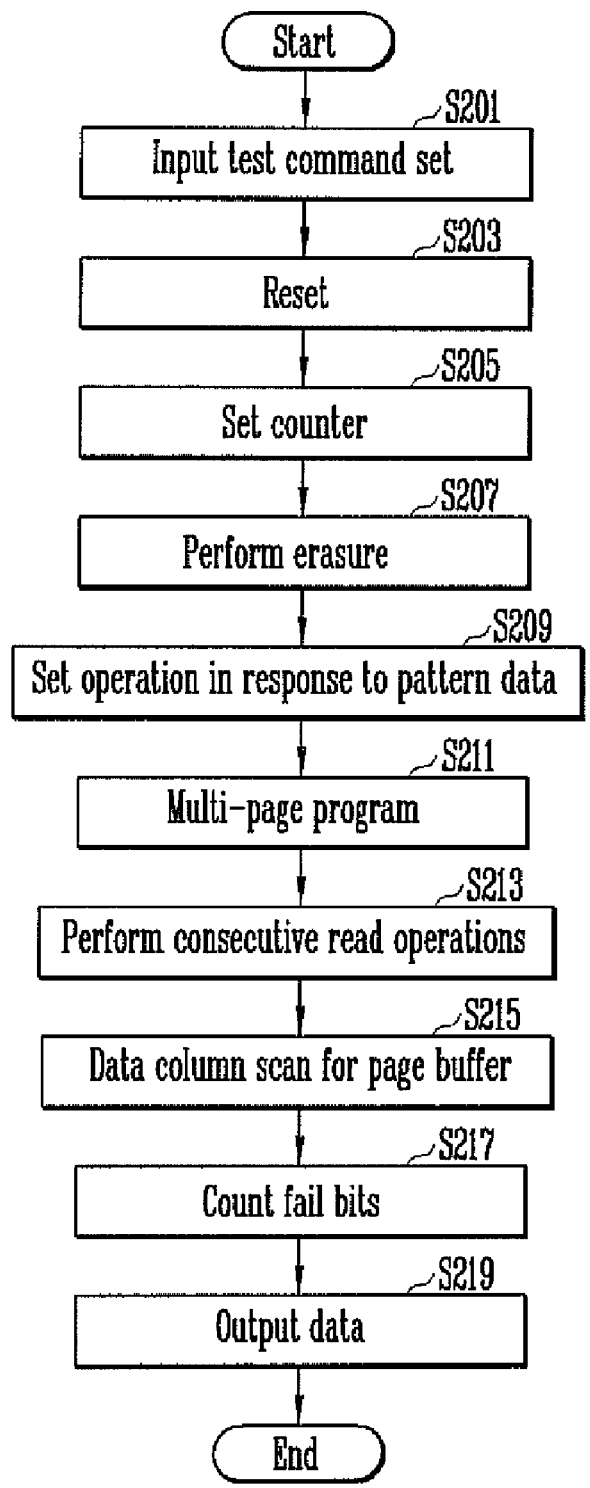

FIG. 3A

|      | BLe | BLo | BLe | BLo |
|------|-----|-----|-----|-----|
| WL0  | 0   | 0   | 0   | 0   |
| ...  | ... | ... | ... | ... |
| WL1  | 0   | 0   | 0   | 0   |
| ...  | ... | ... | ... | ... |
| WL30 | 0   | 0   | 0   | 0   |
| WL31 | 0   | 0   | 0   | 0   |

FIG. 3B

|      | BLe | BLo | BLe | BLo |
|------|-----|-----|-----|-----|
| WL0  | 0   | 0   | 0   | 0   |
| WL1  | 1   | 1   | 1   | 1   |
| ...  | ... | ... | ... | ... |
| WL30 | 0   | 0   | 0   | 0   |
| WL31 | 1   | 1   | 1   | 1   |

FIG. 3C

|      | BLe | BLo | BLe | BLo |
|------|-----|-----|-----|-----|
| WL0  | 0   | 1   | 0   | 1   |
| WL1  | 0   | 1   | 0   | 1   |
| ...  | ... | ... | ... | ... |
| WL30 | 0   | 1   | 0   | 1   |
| WL31 | 0   | 1   | 0   | 1   |

FIG. 3D

|      | BLe | BLo | BLe | BLo |
|------|-----|-----|-----|-----|
| WL0  | 0   | 1   | 0   | 1   |
| WL1  | 1   | 0   | 1   | 0   |
| ...  | ... | ... | ... | ... |
| WL30 | 0   | 1   | 0   | 1   |
| WL31 | 1   | 0   | 1   | 0   |

FIG. 4

|      | Col1 |   |   |   | Col2 |   |     |   |   |   |   |
|------|------|---|---|---|------|---|-----|---|---|---|---|
| WL0  | 1 0  | 1 | 1 | 0 | 1 0  | ... | 0 | 1 | 1 | 1 |
| WL1  | 1 0  | 1 | 1 | 0 | 1 0  | ... | 0 | 1 | 1 | 1 |
| WL2  | 1 0  | 1 | 1 | 0 | 1 1  | ... | 0 | 1 | 1 | 1 |
| ...  | 1 0  | 1 | 1 | 0 | 1 0  | ... | 0 | 1 | 1 | 1 |
| WL30 | 1 0  | 1 | 1 | 0 | 0 0  | ... | 0 | 1 | 1 | 1 |
| WL31 | 1 0  | 1 | 1 | 0 | 1 0  | ... | 0 | 1 | 1 | 1 |

~BK

| PB | 1 1 | 1 | 1 | 1 | 0 0 | ... | 1 | 1 | 1 | 1 |

PB1   PB2

NONVOLATILE MEMORY DEVICE AND METHOD OF TESTING THE SAME

CROSS-REFERENCE TO RELATED APPLICATION

Priority to Korean patent application number 10-2009-0041672 filed on May 13, 2009, the entire disclosure of which is incorporated by reference herein, is claimed.

BACKGROUND

Exemplary embodiments relate to a nonvolatile memory device and, more particularly, to a nonvolatile memory device configured to have an algorithm and pattern data for a self-test built therein, and a method of testing the same.

A nonvolatile memory device may have the advantages of random access memory (RAM), such as enabling the writing and erasure of data, and read only memory (ROM), such as retaining data even without the supply of power, and so has recently been widely used for the storage media of portable electronic devices, such as digital cameras, personal digital assistants (PDAs), and MP3 players.

The nonvolatile memory device may include a memory cell array, a row decoder, a page buffer unit, etc. The memory cell array may include a plurality of word lines elongated in rows, a plurality of bit lines elongated in columns, and a plurality of cell strings corresponding to the respective bit lines.

Memory cells have varying threshold voltages according to their program states. It is ideal that the memory cells have the same threshold voltage according to the state of data to be stored. However, when a program operation is actually performed on the memory cells, the threshold voltages of the memory cells may have probability distributions in some regions because of various external environments, such as the device characteristics and the coupling effect.

To check for a fail memory cell from among the memory cells of the memory device, a test method is used in which an external host is coupled to the memory device, patterns for a test are inputted using the host, and several pages of the memory cells are programmed and read using the test patterns.

Such a test method may be problematic in that it uses lots of resources, such as a host and coupling equipment, and is inefficient in terms of time and the cost of production because a memory device has to be coupled to an external host.

BRIEF SUMMARY

Exemplary embodiments relate to a nonvolatile memory device capable of performing a self-test without being coupled to an external host or equipment, and a method of testing the same.

A nonvolatile memory device according to an aspect of this disclosure includes a storage unit configured to store pattern data selected based on a test command set, and a control unit configured to consecutively perform a program operation on a number of pages in response to the pattern data to obtain programmed pages, consecutively perform a read operation on the programmed pages, and provide information about a bit line coupled to a fail memory cell and about a number of fail bit lines checked as a result of the read operation.

The control unit is configured to perform the program operation while changing word line addresses and bit line addresses of a memory block for storing data in response to the pattern data.

The pattern data are stored in an additional storage unit included in the control unit.

The control unit is configured to consecutively perform the read operation on the programmed pages without resetting a page buffer.

The nonvolatile memory device further includes a counter configured to count a number of bit lines coupled to a fail memory cell.

The test command set includes a test execution command, first and second addresses, and a pattern data selection command.

The first address is a page and block address at which a test is started, and the second address is a page and block address at which the test is terminated.

A nonvolatile memory device according to another aspect of this disclosure includes a memory cell array configured to comprise memory blocks, including memory cells configured to store data and coupled to bit lines and word lines, a page buffer unit configured to include page buffers coupled to the bit lines, a storage unit configured to store pattern data selected based on a test command set, and a control unit configured to consecutively perform program and read operations on a number of pages, selected based on address information, in response to the pattern data, and to store a result of the read operations in the page buffer.

The address information comprises first and second addresses.

The nonvolatile memory device further includes a counter configured to count fail data in the result.

The test command set includes a test execution command, a first address indicative of a page and block address at which a test is started, a second address indicative of a page and block address at which the test is terminated, and a pattern data selection command.

A method of testing a nonvolatile memory device according to yet another aspect of this disclosure includes inputting a test command set, consecutively programming data into test pages in response to pattern data included in the test command set, sequentially reading the data programmed into the test pages, accumulating the data without resetting a page buffer, and storing the data in the page buffer, and determining a bit line coupled to a fail memory cell using the data stored in the page buffer.

The method of testing further includes consecutively selecting the test pages, consecutively reading the data of the test pages, and consecutively accumulating and storing the data without resetting the page buffer.

The method of testing further includes counting a number of bit lines coupled to a fail memory cell based on the data stored in the page buffer.

The inputting of the test command set includes inputting a test command, inputting a first address at which a test will be started, inputting a second address at which the test will be terminated, and selecting pattern data for determining a sequence of programming the test pages selected based on the first and second addresses.

The programming of the data includes consecutively programming data into a number of the test pages selected based on the sequence selected in response to the pattern data.

BRIEF DESCRIPTION OF THE DRAWINGS

FIG. 2 is a flowchart illustrating a method of testing a nonvolatile memory device according to an exemplary embodiment of this disclosure;

FIGS. 3A to 3D show examples of pattern data; and

FIG. 4 shows the data states of memory blocks and page buffers according to an exemplary embodiment of this disclosure.

DESCRIPTION OF EMBODIMENTS

Figure 1:
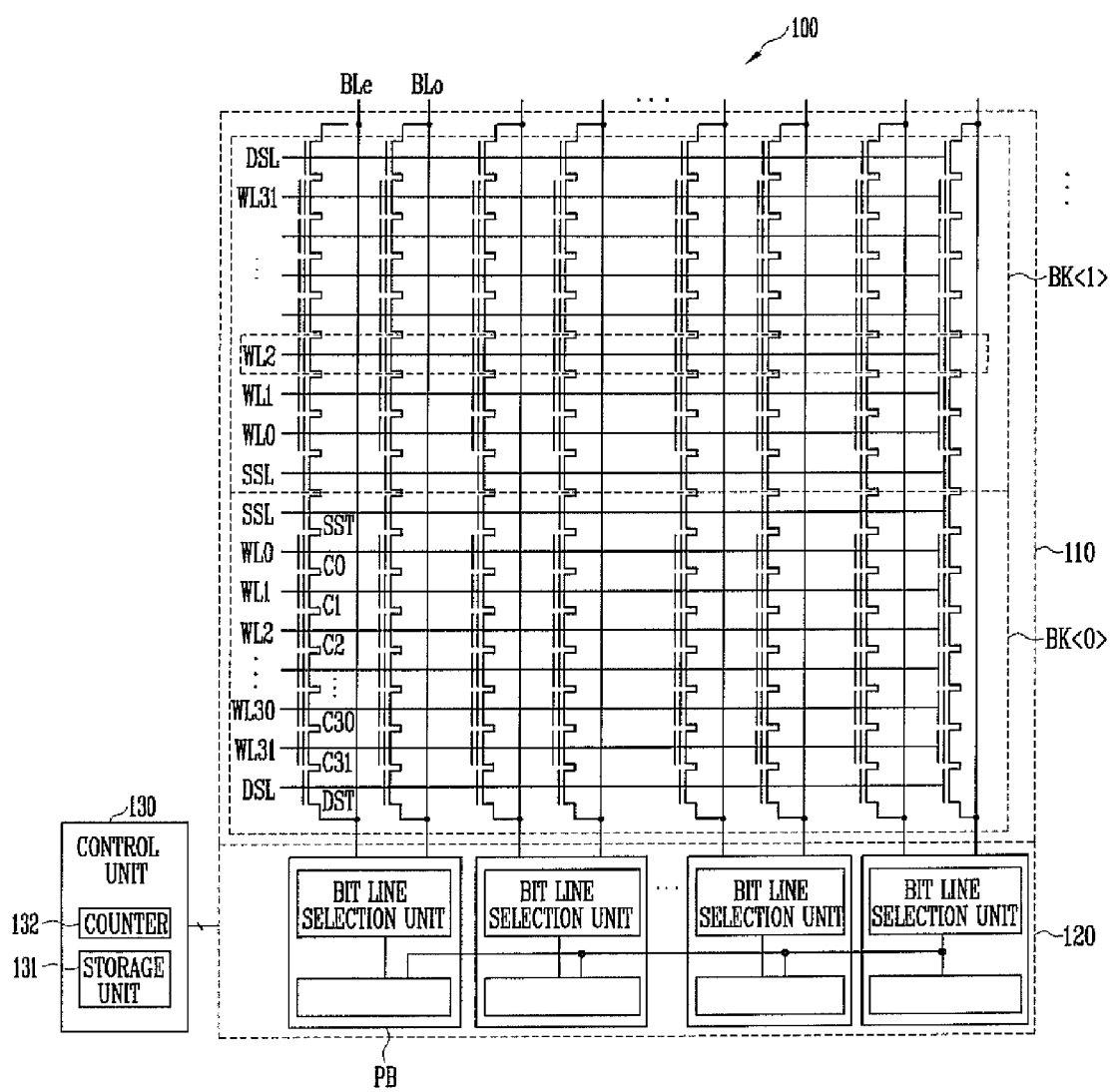
FIG. 1 is a block diagram of a nonvolatile memory device according to an exemplary embodiment of this disclosure.

Hereinafter, some embodiments of the present disclosure will be described in detail with reference to the accompanying drawings. The figures are provided to allow those having ordinary skill in the art to understand the scope of the embodiments of the disclosure.

FIG. 1 is a block diagram of a nonvolatile memory device according to an embodiment of this disclosure.

Referring to FIG. 1, the nonvolatile memory device 100 includes a memory cell array 110, a page buffer unit 120, and a control unit 130.

The memory cell array 110 includes a number of memory blocks BK (although FIG. 1 only shows first and second memory blocks BK<0> and BK<1>).

Each of the memory blocks BK includes a number of cell strings coupled to respective bit lines. Each of the cell strings includes $0^{th}$ to thirty-first memory cells C0 to C31 coupled in series between a drain select transistor DST and a source select transistor SST.

$0^{th}$ to thirty-first word lines WL0 to WL31 are respectively coupled to the gates of the $0^{th}$ to thirty-first memory cells C0 to C31. Each word line can be used as a page when a program operation is performed. In the case in which a memory cell is a multi-level cell (MLC) capable of storing data of 2 bits or more, several logic pages exist in one word line. However, for the sake of simplicity, in the exemplary embodiments of this disclosure, it is assumed that one word line is one page.

The page buffer unit 120 includes a number of page buffers PB.

Each of the page buffers PB is coupled to a pair of bit lines including an even and odd bit line BLe, BLo. Further, each page buffer PB is configured to store data to be programmed into a memory cell selected by a word line and a bit line, or to latch and store data programmed into a selected memory cell.

The control unit 130 is configured to control the program, read, or erase operation of the nonvolatile memory device 100. The control unit 130 is configured to determine whether a selected memory cell is a fail memory cell by programming data and reading data into and from the selected memory cell in response to pattern data previously stored, in order to test the selected memory cell according to a newly added test command set. To this end, the control unit 130 includes a storage unit 131 configured to store test pattern data and algorithm data for controlling a test operation based on the test command set. With regards to reading data, a consecutive read method of determining whether there is a fail memory cell by consecutively reading data of selected word lines and outputting the read data only once is used. The consecutive read method is also called a compressed read method. In this method, data of several pages are consecutively read, fail data are fixed and accumulated, and read data are finally outputted only once.

The control unit 130 further includes a counter 132 configured to count the number of fail bits according to a result of the test and provide a result of the count.

The nonvolatile memory device 100 according to an exemplary embodiment of this disclosure further includes peripheral circuits, such as a voltage supply unit, an X decoder, and a Y decoder. However, only elements necessary to describe the embodiments of this disclosure are shown in FIG. 1.

FIG. 2 is a flowchart illustrating a method of testing a nonvolatile memory device according to an exemplary embodiment of this disclosure.

Referring to FIG. 2, a test command set is inputted at step S201.

The test command set is a command set to execute an algorithm for the start and operation of a test. The test command set is previously configured and stored in the storage unit 131 of the control unit 130 in the form of an algorithm.

The test command set includes a setup command (Setup command), a start address (Start page&block address), a first confirmation command (Confirm command1), an end address (End page&block address), a second confirmation command (Confirm command2), a pattern selection command, and a third confirmation command (Confirm command3).

The setup command is used to inform the execution of a test. The start address and the end address indicate memory block and page addresses on which a test will be started and ended. In the embodiments of this disclosure, it is assumed that $0^{th}$ to $n^{th}$ word lines within the same memory block are tested.

The pattern selection command is used to select one of several pattern data stored in the storage unit 131.

The third confirmation command is used to initiate a test operation.

The control unit 130 prepares a test operation by loading an algorithm for performing the test operation from the storage unit 131 in response to the setup command and starts the test in response to the third confirmation command.

The control unit 130 resets the latch circuits of a page buffer PB at step S203 and then resets the counter 132 at step S205.

Next, the control unit 130 checks a memory block address in the start address and the end address and erases a corresponding memory block at step S207.

The control unit 130 sets the sequence of programs such that the programs are performed based on pattern data selected in response to the pattern selection command, and then inputs data '0' for the program to the page buffer PB at step S209. The pattern data refer to a rule, which defines the sequence of programming data '0', stored in the page buffer PB, into the memory cells of the page buffer PB in various sequences of the word lines and the bit lines.

Next, the control unit 130 performs a multi-page program at step S211. The term 'multi-page program' refers to a step where the control unit 130 selects a word line and a bit line, and performs a program on them in response to the pattern data set in the page buffer PB at step S209.

A change of data programmed into memory cells after a word line and a bit line are selected in response to pattern data is described in detail with reference to an embodiment regarding the pattern data.

After the multi-page program is completed, a read operation is consecutively performed on the pages on which the program operation has been performed, at step S213. If the consecutive read operation is performed, data latched in the page buffer PB are not outputted immediately after the data are read. Instead, the read data are accumulated in the page buffer PB while the $0^{th}$ to thirty-first word lines are sequentially changed.

If, as a result of the data accumulation, all the pages have the same data, data '1' is stored in the page buffer PB. If, as a result of the data accumulation, any one of the pages has different data, data '0' is stored in the page buffer PB.

To this end, like the execution of a verification operation, if a program operation has been normally performed, it is recognized as a pass, and data stored in the data latch of the page buffer PB remain intact. If even one fail is recognized, data stored in the data latch of the page buffer PB are changed to indicate that a fail has occurred. Thus, a result in which the fail has occurred is not changed until a read operation on all the pages is completed.

After the consecutive read is completed, a column scan operation is performed on the data of the page buffer PB at step S215. The counter 132 counts the number of fail data simultaneously with the column scan at step S217. Next, the results of performing the column scan and counting fail bits are externally outputted at step S219, so that whether the nonvolatile memory device 200 has a fail can be determined.

Furthermore, the control unit 130 can store information about a bit line address having a fail according to the column scan in the storage unit 131 such that the information can be used for subsequent column repair. Additionally, whether a memory block is a pass or a fail can be determined based on the number of counted fail bits. For example, when the number of counted fail bits exceeds a certain value, a corresponding memory block can be treated as a bad block.

The pattern data set at step S209 are stored in the storage unit 131.

FIGS. 3A to 3D show examples of pattern data.

FIGS. 3A to 3D show a memory block programmed according to first to fourth pattern data, respectively. In the case in which data '0' is inputted to the 0th to thirty-first word lines, a program operation is performed. Data '1' refers to data which maintain an erase state.

First pattern data shown in FIG. 3A correspond to a case in which the memory cells coupled to all the word lines and all the even and odd bit lines are programmed. To this end, data '0' is inputted to the data latches of all the page buffers PB of the page buffer unit 120.

Further, in the sequence of programs performed at step S211, the even bit lines and the odd bit lines coupled to the $0^{th}$ word line WL0 are sequentially selected, and memory cells coupled to the selected even and odd bit lines are sequentially programmed. Then, the even bit lines and the odd bit lines coupled to the first word line WL1 are sequentially selected, and memory cells coupled to the selected even and odd bit lines are sequentially programmed. Each word line is sequentially programmed until all word lines WL of the memory block are programmed. Here, the last word line is the thirty-first word line WL31, and therefore, the even bit lines and the odd bit lines coupled to the thirty-first word line WL31 are sequentially selected, and memory cells coupled to the selected even and odd bit lines are programmed. Accordingly, all the memory cells of the memory block are programmed.

Second pattern data shown in FIG. 3B correspond to a case in which only the even-numbered word lines from among all the word lines, starting from the $0^{th}$ word line WL0, are selected. Therefore, only the memory cells coupled to the even and odd bit lines corresponding to the selected even-numbered word lines are programmed. To this end, word lines and column lines are selected such that the control unit 130 can sequentially select the even-numbered word lines and the even and odd bit lines based on the second pattern data.

Alternatively, the second pattern data may be controlled such that only odd-numbered word lines from among all the word lines, starting from the first word line WL1, are selected. Therefore, only the memory cells coupled to the even and odd bit lines corresponding to the selected odd-numbered word lines are programmed.

Third pattern data shown in FIG. 3C correspond to a case in which only the even bit lines coupled to all the word lines are selected, so that only memory cells coupled to the even bit lines are programmed. That is, data '0' is only inputted to the memory cells coupled to the even bit lines in order to program the memory cells.

To this end, the control unit 130 sequentially selects the $0^{th}$ to thirty-first word lines, selects only the even-numbered word lines, and programs only the memory cells coupled to the selected even-numbered word lines.

Fourth pattern data shown in FIG. 3D correspond to a case in which the even bit lines and the odd bit lines are alternately selected while all the word lines are sequentially selected. In other words, when the even bit lines coupled to the even-numbered word lines are selected and a program operation is performed on the selected even bit lines, the odd bit lines coupled to the odd-numbered word lines are selected and a program operation is performed on the selected odd-numbered word lines, and vice versa.

As described above, after the word lines and the bit lines are selected and programmed based on pattern data, data inputted to the page buffer through the consecutive read method are described below.

FIG. 4 shows data states of memory blocks and page buffers according to an exemplary embodiment of this disclosure.

FIG. 4 shows a state in which data are stored in memory cells coupled to the $0^{th}$ to thirty-first word lines of the memory block BK according to specific pattern data. As a result of consecutively reading data, the same data are programmed in the memory cells coupled to the $0^{th}$ to thirty-first word lines of a first column Col1. That is, desired data are normally programmed in the memory cells. Accordingly, data '1' is inputted to a first page buffer PB1 coupled to the first column Col1.

Meanwhile, in a second column Col2, data stored in the memory cells coupled to the second and thirtieth word lines WL2, WL30 differ from data stored in the memory cells coupled to the remaining word lines. That is, it can be seen that the corresponding memory cells are fail memory cells.

Accordingly, data '0,' instead of data '1,' is inputted to a second page buffer PB2 coupled to the second column Col2, indicating that the second column Col2 is a fail column. As described above, information about the fail column can be checked at step S215 of FIG. 2.

Furthermore, when the counter 132 counts only the number of data '0', the number of bit lines coupled to fail memory cells can be checked.

Accordingly, whether a memory cell is a fail memory cell can be tested only using an internal test command set and pattern data, without using an external test apparatus through such a test method. Processing, such as column repair and bad block determination within a memory block, can be performed based on the test result.

As described above, according to the nonvolatile memory device and the method of testing the same according to this disclosure, pattern data including an algorithm for checking a fail memory cell based on a test command are stored in a nonvolatile memory device. Accordingly, efficiency in terms of time and cost can be improved because a self-test can be performed within a nonvolatile memory device without an external host.

What is claimed is:
1. A nonvolatile memory device, comprising:
a storage unit configured to store pattern data selected based on a test command set; and
a control unit configured to consecutively perform a program operation on a number of pages in response to the pattern data to obtain programmed pages, consecutively perform a read operation on the programmed pages, and provide information about a bit line coupled to a fail memory cell and about a number of fail bit lines checked as a result of the read operation.

2. The nonvolatile memory device of claim 1, wherein the control unit is configured to perform the program operation while changing word line addresses and bit line addresses of a memory block for storing data in response to the pattern data.

3. The nonvolatile memory device of claim 1, wherein the pattern data are stored in an additional storage unit included in the control unit.

4. The nonvolatile memory device of claim 2, wherein the control unit is configured to consecutively perform the read operation on the programmed pages without resetting a page buffer.

5. The nonvolatile memory device of claim 2, further comprising a counter configured to count a number of bit lines coupled to a fail memory cell.

6. The nonvolatile memory device of claim 1, wherein the test command set comprises:
   a test execution command;
   first and second addresses; and
   a pattern data selection command.

7. The nonvolatile memory device of claim 6, wherein:
   the first address is a page and block address at which a test is started, and
   the second address is a page and block address at which the test is terminated.

8. A nonvolatile memory device, comprising:
   a memory cell array configured to comprise memory blocks, comprising memory cells configured to store data and coupled to bit lines and word lines;
   a page buffer unit configured to comprise page buffers coupled to the bit lines;
   a storage unit configured to store pattern data selected based on a test command set; and
   a control unit configured to consecutively perform program and read operations on a number of pages, selected based on address information, in response to the pattern data, and to store a result of the read operations in the page buffer.

9. The nonvolatile memory device of claim 8, wherein the address information comprises first and second addresses.

10. The nonvolatile memory device of claim 8, further comprising a counter configured to count fail data in the result.

11. The nonvolatile memory device of claim 8, wherein the test command set comprises:
   a test execution command;
   a first address indicative of a page and block address at which a test is started;
   a second address indicative of a page and block address at which the test is terminated; and
   a pattern data selection command.

12. A method of testing a nonvolatile memory device, comprising:
   inputting a test command set;
   consecutively programming data into test pages in response to pattern data included in the test command set;
   sequentially reading the data programmed into the test pages, accumulating the data without resetting a page buffer, and storing the data in the page buffer; and
   determining a bit line coupled to a fail memory cell using the data stored in the page buffer.

13. The method of claim 12, further comprising consecutively selecting the test pages, consecutively reading the data of the test pages, and consecutively accumulating and storing the data without resetting the page buffer.

14. The method of claim 12, further comprising counting a number of bit lines coupled to a fail memory cell based on the data stored in the page buffer.

15. The method of claim 12, wherein the inputting of the test command set comprises:
   inputting a test command;
   inputting a first address at which a test will be started;
   inputting a second address at which the test will be terminated; and
   selecting pattern data for determining a sequence of programming the test pages selected based on the first and second addresses.

16. The method of claim 15, wherein the programming of the data comprises consecutively programming data into a number of the test pages selected based on the sequence selected in response to the pattern data.

* * * * *